US006337032B1

(12) United States Patent
Chivukula et al.

(10) Patent No.: US 6,337,032 B1
(45) Date of Patent: Jan. 8, 2002

(54) SOL-GEL PRECURSOR AND METHOD FOR FORMATION OF FERROELECTRIC MATERIALS FOR INTEGRATED CIRCUITS

(75) Inventors: Vasanta Chivukula, Nepean; Michael Sayer, Kingston; David R. McDonald, Ottawa, all of (CA); Ismail T. Emesh, Beaverton, OR (US)

(73) Assignees: Nortel Networks Limited, Montreal; Queen's University, Kingston, both of (CA)

( * ) Notice: Subject to any disclaimer, the term of this patent is extended or adjusted under 35 U.S.C. 154(b) by 0 days.

(21) Appl. No.: 09/504,954

(22) Filed: Feb. 16, 2000

Related U.S. Application Data

(62) Division of application No. 08/685,443, filed on Jul. 25, 1996, now Pat. No. 6,066,581.
(60) Provisional application No. 60/001,577, filed on Jul. 27, 1995.

(51) Int. Cl.$^7$ ................................................ H01L 21/02
(52) U.S. Cl. .......................... 252/62.9 R; 252/62.9 PZ; 501/134; 501/135; 501/136; 501/138; 427/100; 427/226
(58) Field of Search .................... 252/62.9 R, 62.9 PZ; 427/100, 226; 501/134, 135, 136, 138

(56) References Cited

U.S. PATENT DOCUMENTS

| | | | |
|---|---|---|---|
| 3,292,994 A | 12/1966 | Kiss et al. ................... 423/598 |
| 4,537,865 A | 8/1985 | Okabe et al. ................ 501/137 |
| 4,636,908 A | 1/1987 | Yoshihara et al. ........... 501/136 |
| 4,789,653 A | 12/1988 | Ogata et al. ................. 501/134 |
| H626 H | 4/1989 | Covino ........................ 501/12 |
| 4,849,296 A | 7/1989 | Haluska et al. .............. 428/457 |
| 4,946,710 A | 8/1990 | Miller et al. ............. 427/126.3 |
| 4,957,888 A | 9/1990 | Brand et al. ................. 501/135 |
| 4,963,390 A | 10/1990 | Lipeles et al. .............. 427/110 |
| 5,032,559 A | 7/1991 | McSweeney et al. ........ 501/137 |
| 5,066,617 A | 11/1991 | Tanemoto et al. ........... 501/134 |
| 5,087,437 A | 2/1992 | Bruno et al. ................. 501/134 |
| 5,198,269 A | 3/1993 | Swartz et al. ................ 427/236 |
| 5,271,955 A | 12/1993 | Manair ........................ 427/100 |
| 5,342,648 A | 8/1994 | MacKenzie et al. ...... 427/126.3 |
| 5,384,294 A | 1/1995 | Teowee et al. .............. 501/134 |
| 5,391,393 A | 2/1995 | Manair ........................ 427/100 |
| 5,728,603 A | * 3/1998 | Emesh et al. ................ 437/235 |
| 5,886,867 A | * 3/1999 | Chivukula et al. ........... 361/311 |
| 6,077,715 A | * 6/2000 | Chivukula et al. ............ 438/3 |

FOREIGN PATENT DOCUMENTS

| | | |
|---|---|---|
| EP | 0 489 519 A2 | 6/1992 |
| WO | 90/13149 | 11/1990 |

OTHER PUBLICATIONS

Guanghua Yi et al in "Sol–Gel Processing of Complex Oxide films" in Ceramic Buletin, vol. 70, No. 7, 1991 pp. 1173–1179.
R. W. Schwartz et al., "Solution chemistry Effects in Pb(Zr, Ti)O$_3$ Thin Film Processing", in Integrated Ferroelectics vol. 2, 1991, pp. 243–254.

* cited by examiner

*Primary Examiner*—C. Melissa Koslow
(74) *Attorney, Agent, or Firm*—Foley & Lardner

(57) ABSTRACT

A sol-gel precursor mixture for forming a perovskite ferroelectric material and a method for forming a ferroelectric material are provided. The precursor solution comprises a sol-gel formulation of a mixture of an inorganic salt of at least one metal, and metal-organic compounds of other constituent metals in a suitable pH controlled aqueous solvent mixture to form a stable, clear sol-gel mixture. The precursor solution and method provides for formation of thin layers of other ferroelectric dielectrics and piezoelectric materials, particularly lead containing materials, for application including non-volatile DRAMs, optoelectronic devices relying on non-linear optical properties, and piezoelectric devices, and is compatible with processing for submicron device structures for bipolar, CMOS or bipolar CMOS circuits.

16 Claims, No Drawings

SOL-GEL PRECURSOR AND METHOD FOR FORMATION OF FERROELECTRIC MATERIALS FOR INTEGRATED CIRCUITS

This application is a divisional of application Ser. No. 08/685,443, filed Jul. 25, 1996, now U.S. Pat. No. 6,066,581.

This application claims benifit to provisional Application No. 60/001,577 filed Jul. 27, 1995.

FIELD OF INVENTION

This invention relates to a sol-gel precursor solution for forming a perovskite ferroelectric material and a method for forming ferroelectric materials for integrated circuits, with particular application for fabrication of ferroelectric dielectric and piezoelectric materials. Particular aspects of the invention relate to lead containing ferroelectric dielectric materials, including lead zirconate titanate (PZT), lead lanthanum zirconate titanate (PLZT), lead magnesium niobate (PMN), lead iron niobate (PFN).

BACKGROUND OF THE INVENTION

In recent years, the use of the ferroelectric materials for random access memory (RAM) elements has reached commercial applications in the semiconductor industry. Ferroelectric dielectric materials have very high dielectric constants (typically $\epsilon > 500$) providing for memory elements that have high charge storage capacity. Ferroelectric memory elements are non-volatile, consume low power and are programmable with low voltage, e.g. less than 5V. Other advantages include fast access times, (<40 ns), radiation hardness, and robustness with respect to virtually unlimited read and write cycles.

Ferroelectric dielectrics are of also of interest for applications as coupling and decoupling capacitors, and for filter elements operating at low frequency (<1 Hz) up to microwave (GHz) frequencies. The relatively low value of the dielectric constant of conventional dielectrics, typically silicon dioxide and silicon nitride ($\epsilon < 10$) limits the capacitance attainable to about 2 to 3 $fF/\mu m^2$. The high dielectric constant of ferroelectric dielectric materials allows for capacitances greater than 30 $fF/\mu m^2$. A number of integrated circuit applications would benefit from large on-chip capacitances in the nF range. Consequently, there is much interest in ferroelectric dielectric materials for larger, high value capacitors, as well as for smaller memory elements.

Since ferroelectric materials may also exhibit useful piezoelectric and non-linear optical properties, there is also much interest in providing improved methods for making thin film ferroelectric materials for optoelectronics and other applications, e.g. waveguides, electro-acoustic transducers, surface acoustic wave devices, non-linear optical devices, optical modulators and piezoelectric devices. The high piezoelectric coupling coefficient of ferroelectric materials make them suitable as actuators for micromachine structures incorporated in silicon micro-circuits.

Ferroelectric dielectric materials with large dielectric constants include ferroelectric perovskites, which are complex metal oxides of the general structure $ABO_3$ in which the A and B sites of the perovskite structure are occupied by one or more different metals. Particular perovskite ferroelectric materials which have made the breakthrough in integrated circuit applications include, for example, lead zirconate titanate $PbZr_xTi_{1-x}O_3$ (PZT), lead lanthanum zirconium titanate (PLZT), barium titanate (BT), and barium strontium titanate (BST).

PZT has a higher dielectric constant and may be formed at lower temperature than BST. On the other hand, PZT formed by conventional methods shows dispersion, at frequencies above ~100 MHz, above which the dielectric constant drops to a low value. BST has a flat dielectric response up to ~5 GHz and is favoured for high frequency GaAs integrated circuit applications.

The interest in using ferroelectric materials for applications in non-volatile DRAMs has led to rapid development of improved processes for deposition of thin layers of ferroelectric dielectric materials. Known deposition methods which have been investigated include, for example, metallo-organic sol-gel processes, and other spin-on liquid processes based on metallo-organic decomposition, chemical vapour deposition (CVD) and sputtering, laser ablation, electron beam deposition and ion beam deposition.

The integration of ferroelectric materials for capacitor dielectrics for integrated circuits, or for other device structures, requires a process which is compatible with known semiconductor process technologies. Furthermore, the properties of ferroelectric materials provided as thin films are found to differ from bulk ferroelectric materials. In comparison with preparation of bulk ferroelectric materials, factors including film stress, interactions with substrate materials, and restrictions on process temperatures may significantly influence the characteristics of thin films of ferroelectric materials. Thus, much work has been devoted to developing low temperature processes for formation of thin films of ferroelectric dielectrics compatible with semiconductor processing for CMOS, bipolar and bipolar CMOS technologies.

For integrated circuit applications, a preferred known process for forming thin films of ferroelectric materials is based on a technique, generally known as a sol-gel process, in which a complex oxide is prepared from a sol-gel precursor solution comprising a mixture of metallo-organic[1] compounds, e.g. alkoxides dissolved in an organic solvent, and/or organic metal salts dissolved in an appropriate solvent e.g. an acid or alcohol. The sol-gel process for preparing metal oxides proceeds by the hydrolysis of a metal organic compound to form a sol comprising metal oxide precursors. This process is well known for forming single component oxide glasses and multi-component oxide glasses from a precursor mixture of metal alkoxides. Formation of metal oxide bonds and growth of metal oxide chains and networks in the solution eventually lead to gelation. The hydrolysis and polymerization by condensation (polycondensation) reactions are controlled by factors such as the amount of water, pH, presence of acid or base catalysts, and reaction sequence, for example, as described in U.S. Statutory invention registration no. H 626, published Apr. 4, 1989, entitled "Sol-Gel Ceramic Oxides" to Covino which relates to formation of silicate glasses. In the latter disclosure, it is described how it is known that lowering of pH tends to form oxide networks and chains, forming a polymer network, and leading to gelation without formation of colloidal oxides.

[1] In the context of sol-gel processing of complex oxide ceramics, the term organo-metallic or metallo-organic has often been used to denote metal containing organic compounds used as precursors, including metal alkoxides, metal carboxylates and metal beta diketonates. In organic chemistry, the term "organo-metallic" or metallo-organic is more generally used to denote a compound having a metal-carbon bond.

In a conventional method of sol-gel processing of piezoelectric and ferroelectric dielectric thin films of the general formula $ABO_3$ using a sol-gel precursor solution, a precursor solution is provided comprising metal A as an organo-metallic salt, e.g. a metal acetate, and a mixture of metals B as alkoxides, provided in the required stoichiometric proportions. For example, to make PZT, a precursor mixture of a soluble organic lead salt, e.g. lead acetate tri-hydrate, and a mixture of zirconium propoxide $Zr(OC_3H_7)$ and a titanium iso-propoxide $Ti(OC_3H_7)_4$ is dissolved in a suitable solvent e.g. an alcohol, or mixture of solvents. The lead salt is dissolved in a suitable anhydrous solvent such as methoxyethanol, and the solution is dehydrated, and then the zirconium and titanium propoxides, also dissolved methoxyethanol, are added in stoichiometric ratio to provide the B metal cations.

The metal oxide precursor solution forms a mixture of metallo-organic intermediate compounds which react to form a metal oxide precursor. The viscosity and surface tension of the precursor solution is adjusted to allow a layer with a controlled thickness to be spin-coated or dip-coated onto a substrate, as required, depending on the particular application.

Organic metal oxide precursors other than metal alkoxides which have been reported include metal beta-diketonate (e.g. acetyl acetonate) or metal carboxylates, e.g. acetates. For example U.S. Pat. No. 4,946,710 to Miller entitled "Method for preparing PLZT, PZT, and PLT sol-gels and fabricating ferroelectric thin films", lists precursors including lead acetate, lead tetraethylhexanoate, zirconium, acetyl acetonate, titanium tetra-butoxide butanol complex, titanium iso-propoxide, zirconium tetra-butoxide, lanthanum 2,4, pentadionate, and other acetates and alkoxides which are commercially available and form organo-metallic polymer gels. Nevertheless it is noted that precursor compounds with bulky organic groups are likely to result in porous materials with defects, and thus metal compounds derived from methanol, ethanol, butanol, propanol and acetic acid derived compounds were preferred.

Desirably, there is a common solvent for all precursor solutions of metals A and B. When different solvents are used, solubilization of the metal precursors in different solvents may hinder the formulation of a homogeneous sol-gel solution. In known methods, solvents comprising alcohols, methanol, butanol, propanol, etc. and methoxy-alcohols, e.g. methoxy-ethanol, 1-methoxy-2-propanol are preferred.

In PZT, the ratio of zirconium to titanium occupying the B sites of the $ABO_3$ structure may be varied, and is typically in the range from 20:80 to 80:20, with 40:60 ratio of Zr:Ti being typical. In doped or modified materials, another metal may occupy a proportion of the A sites. One particular example is lead lanthanum zirconium titanate (PLZT) where some of the A sites are filled by lanthanum. PZT may alternatively be modified or doped with other metals, including niobium, tantalum, iron, aluminum and others. These metals are also added in the desired proportion to the sol-gel precursor solution in the form of organo-metallic compounds, typically as metal alkoxides $M(OR)_x$ or metal carboxylates, typically a metal acetate. Dopant metals are alternatively added as chlorides of iron, or vanadium, e.g. $VCl_3$, or a chloride or nitrate of lanthanum.

Conventionally, to provide a thin layer of ferroelectric, a substrate is spin-coated or dipped to provide a thin layer on the substrate, and then a heating step at relatively low temperature, ~200° C. to 400° C., results in pyrolysis, i.e. thermal decomposition of the organo-metallic[1] compounds, and drives off solvent and volatile organics, and leaving a layer comprising the mixed metal oxides, which transform at sufficiently high temperature, to form a layer of the ferroelectric mixed oxide. The lower temperature step is often referred to as "firing", or "baking". Heating to a higher temperature, typically 600–800° C., causes crystallization to a ferroelectric perovskite phase of a mixed oxide having the required functional properties. The higher temperature step may is referred to variously, e.g. as annealing, or sintering. It is known that the nature of the ferroelectric film is sensitive to the substrate, and to the processing conditions.

Bernstein et al. in European Patent Application No. 0 489 519 A2, entitled "Sol-gel processing of piezoelectric and ferroelectric films", report that rapid localized heating avoids formation of a crust on the surface of the layer, which may prevent outgassing of volatile organic components during heating in a conventional furnace tube. Rapid heating, e.g. by localized heating the substrate on a hot plate, was found to cause localized stabilization of the film while allowing continued outgassing of organics from the surface, a technique that was found to be advantageous in lowering the crystallization temperature. It was also reported that properties of film were more linear with applied voltage when crystallization was carried out in an inert or reducing atmosphere rather than an oxidizing atmosphere.

Bernstein refers to the method of Sayer and Yi described in International Patent Application WO-90/13149, entitled "Sol gel process for preparing $Pb(Zr,Ti)O_3$ thin films". Sayer used acetic acid as a solvent for both lead acetate trihydrate and zirconium and titanium propoxides, rather than methoxy-ethanol, which is a known teratogen. Sayer and Yi provide a method of preparing crack free thin films by addition of what is called a "firing additive", e.g. a glycol such as, ethylene glycol, glycerol, tetraethylene glycol, or a polyethylene glycol, for adjusting the viscous state transition temperature of the sol-gel precursor solution. After heating at 300° C. to 500° C. to pyrolyse the film, crystallization was induced by a lengthy 6 hour anneal at about 600° C. However, for integrated circuit applications, a more rapid anneal step is desirable.

In the earlier work of Sayer et al. described in the above mentioned EP Patent Application, the choice of precursor compounds and solvents is important in controlling the characteristics of thin film ferroelectric materials. Precursor compounds should preferably have a high metal content, high solubility in the selected solvent, decompose without evaporating, and be chemically compatible with one another. The solvent must have appropriate boiling point and suitable viscosity and surface tension. Water and/or propanol may be added to adjust the viscosity, and reduce surface tension to increase wettability of the substrate. A chelating agent is added to prevent hydrolysis of the sol-gel solution, and is preferably glacial acetic acid, although other acids may be used.

The order of mixing of the precursor constituents may also be important. For example, Sayer reported that in mixing the lead salt and metal alkoxides, it is important to add zirconium propoxide first because it reacts with acetic acid to form a non hydrolyzable solution which protects the titanium iso-propoxide from hydrolysis. If Ti iso-propoxide is added first, it reacts with the acetic acid to form mono- or di-acetylates and condensation occurs with the formation of poly-titanyl acetylates. In later work discussed in an article entitled "Sol-gel processing of complex oxide films", in Ceramic Bulletin, vol. 70, no. 7, 1991, pages 1173–1179, Yi and Sayer mixed the Ti and Zr precursors before addition of the lead salt and acetic acid. This procedure has been followed by Schwartz et al. under the name "inverted mixing orders" as reported in Integrated Ferroelectrics vol. 2, 1992, pages 243–254, entitled "Solution chemistry effects in $Pb(Zr,Ti)O_3$ thin film processing".

To provide a homogeneous sol-gel solution, the mixture is agitated, preferably in an ultrasonic tank, until all solids are dissolved. A filtered solution is stable in air, and may be stored in a sealed container.

Sayer et al. also highlight that the low temperature heating step, which they term "firing", which pyrolyses the organometallic compound to an inorganic film, is key to the preparation of the crack free films having desired characteristics including crystal structure, grain size, transparency, and surface roughness.

Evaporation of the solvents and volatile components causes a large volume change, and thus generates internal stresses. During firing, volatile organic components are driven off and the organic film changes to fine mixture of metal oxides, and free carbon. Then at higher temperature the free carbon oxidizes, is released as carbon dioxide, and the mixture of oxides transforms to a transparent amorphous PZT film. Processing and firing under vacuum was found to be advantageous in extracting water uniformly and for uniform decarbonization.

In the method of Sayer et al., it is believed that high boiling point and latent heat of a glycol additive raises the solution evaporation temperature in the first stage towards the melt temperature in the second stage, which retains atom mobility and reduces tendency for cracking.

Other sol-gel based processes for providing improved quality ferroelectric thin films are described in the following references.

Swartz et al. in U.S. Pat. No. 5,198,269 entitled "Process for making sol-gel deposited ferroelectric thin films insensitive to their substrates", describe a stepwise process for improving the quality of a perovskite ferroelectric thin film by depositing a thin "interlayer" of a first perovskite material, e.g. $PbTiO_3$, or $SrTiO_3$ on which is adherent to the substrate, before depositing a second perovskite material, e.g. PLZT or other ferroelectric material. The interlayer was found to improve crystallinity of the PLZT and provide for deposition on a wider range of substrates.

Maniar in U.S. Pat. No. 5,271,955 and continuation U.S. Pat. No. 5,391,393, both entitled "Method for making a semiconductor device having an anhydrous ferroelectric thin film", describes a sol-gel method in which an anhydrous sol-gel precursor is prepared, without hydrolyzing the sol-gel solution. By using anhydrous lead acetate, there is no need to dehydrate the solution, and this compound shows enhanced reactivity with other components. Unlike other known methods in which a condensate is formed by mixing the solutions and then hydrolyzing, this method uses thermally induced condensation, -i.e. by boiling (or refluxing) to induce a heterogeneous condensation reaction between metal precursors in solution. Preparation of the anhydrous solution in an oxygen containing dry ambient resulted in a more stable mixture, reduced degradation of the solution by atmospheric humidity and increased shelf life. Maniar notes that exclusion of water avoids bulky precursor molecules with a high degree of internal strain which occurs with hydrolyzed precursors that tend to polymerize preferentially with a single metal element. Films were prepared from the anhydrous sol-gel solution in a conventional manner, with a heating step to drive off solvent and organic ligands, followed by sintering to interdiffuse metals and form perovskite thin film.

A long shelf life of anhydrous sol-gel solution was reported, using excess lead from 0 to 20%. Excess lead is known to suppress formation of an intermediate pyrochlore phase during annealing. The formulation of the sol-gel exclusively by thermal condensation and in the absence of hydrolysis yields an anhydrous amorphous sol-gel having a uniform condensate composition. The method provides improved durability and lower temperature conversion to perovskite crystalline phase.

Mackenzie et al. in U.S. Pat. No. 5,342,648, entitled "Method for forming amorphous ferroelectric materials" discusses how the morphology of polycrystalline thin films dictates characteristics of the material, and suggests growing single crystal films by sol-gel techniques to avoid shortcomings introduced by grain boundaries in polycrystalline films. Mackenzie uses a precursor mixture of metal alkoxides dissolved in alcohol such as absolute ethanol to provide an anhydrous mixture which is not reacted with water until it is coated onto the substrate. PZT is prepared from a mixture of Ti propoxide and Zr propoxide dissolved in propanol, mixed with lead acetate dissolved in propanol. Hydrolysis and polycondensation of this mixture occurs in situ in the thin film and provides amorphous thin films. That is, when water, e.g. water vapour in air reacts with the thin film, and by control of humidity during processing, a polycondensation of a polymer having metal oxygen-metal bonds occurs controllably. The alkyl groups are released as corresponding alcohol. A pre-polymer may occur as particles in the gel.

Teeowee et al., in U.S. Pat. No. 5,384,294 entitled "Sol-gel derived lead oxide containing ceramics" report a method for production of PZT using a mixture of a lead carboxylate (e.g. lead acetate) in alcohol, and other metal cations provided as a mixture of alkoxides and alkanolamines, i.e. amine derivatives of the more commonly used alkoxides. These are prepared by reacting metal alkoxides with an amine. The alkanolamines are less reactive and less hygroscopic with improved solubility in higher alcohols. Shelf life is prolonged relative to unmodified metal alkoxides. PVP (polyvinyl pyrollidine) is added for sol rheology control, i.e. to control the viscosity and flow properties of the sol-gel solution. Thin films with exceptionally high dielectric constants, up to 3000, were obtained.

A number of processing difficulties arise in known processes including lack of batch to batch uniformity and reproducibility due to instability and degradation of the sol-gel precursor solutions. Special precautions are required for making and storing anhydrous solutions to keep out atmospheric moisture.

Non-uniformities in coating may occur due to inadequate control of the viscosity or surface tension of organic solutions. Cracking may occur during the heating phase, as a result of stress and macroscopic defects generated by the large volume changes when volatile organic components and solvents are driven off. An excessive volume ratio of organic products to the inorganic polymer network can cause porosity and cracks in the fired films, may inhibit reaction of the precursor film components, and give rise to poor crystallization in the fired film. Stress, or poor adhesion to the substrate then may result in delamination of films. Stress and cracking are exacerbated in thicker films (>1 $\mu$m).

While it has been reported that cracking of films may be controlled by firing at lower temperature for extended periods, (i.e. initial heating stage in excess of 20 minutes), extended thermal processing may not be compatible with integrated circuit fabrication, or may result in low quality crystalline layers, with poor ferroelectric characteristics. Rapid thermal processing is preferable for integrated circuit fabrication. However, rapidity of reaction may exacerbate any inhomogeneities in the film, and generation of stresses are significantly. different in rapid thermal processing as compared with furnace annealing.

As in all semiconductor processing, high purity starting reactants are desirable. Nevertheless, because organic metal precursors are used, carbon containing residues of the volatile organic precursors may remain in the film, either in the bulk, or trapped at boundaries between grains. Oxygen loss from the structure may occur during oxidation of residual carbon to carbon dioxide, which results in an oxygen deficient stoichiometry of the ferroelectric phase.

Oxygen stoichiometry is important because the functional properties of the ferroelectric oxide are strongly dependent on the "oxygen octahedra" in the crystal structure. A minimum oxygen stoichiometry is required to maintain the non-centro symmetry of the unit cell. Under most circumstances, known chemical processes yield an oxygen stoichiometry above the critical limit to form a desired crystal structure, and the film is identifiable as a ferroelectric. Nevertheless, oxygen non-stoichiometry, remains a major difficulty to be overcome. If oxygen stoichiometry occurs non-uniformly throughout the film, the average properties of the material will be degraded. For example, processed ferroelectric films generally show dielectric constants which are lower and coercive fields for polarization reversal which are higher than those observed in the bulk material. Films are often not able to withstand repeated polarization reversals for as many repetitions as required. Thus, removal of carbon from the as-coated films is identified as a critical processing stage, and known methods suggest that removal of carbon is best achieved by firing (heating) the films at 350° to 400° C. for a few minutes. Apart from organic precursors, and organic solvents, other organics added as firing additives or to adjust surface tension and viscosity also add to the organic loading of the solution. In lead containing ferroelectrics, the organic lead salt is usually added in excess to suppress formation of a pyrochlore phase. Thus, each of these components contributes to an excess of carbon, and thus may adversely affect oxygen stoichiometry.

SUMMARY OF THE INVENTION

Thus, the present invention seeks to provide a sol-gel precursor solution for formation of a ferroelectric material for integrated circuit applications, and a method of fabrication of ferroelectric dielectric or piezoelectric materials, which avoids or reduces the above mentioned problems, and with particular application to a sol-gel precursor solution and a method for forming lead containing perovskite ferroelectric materials.

Thus according to one aspect of the present invention there is provided a sol-gel precursor solution for preparing a perovskite ferroelectric material of general formula $ABO_3$ wherein A and B each comprise one or more metals, the solution comprising a mixture of compounds of metals A and B wherein a least one of the compounds of A and B is provided by a solution of soluble inorganic metal salt, and the other metals are provided as metallo-organic compounds.

The sol-gel precursor solution comprises an inorganic metal precursor compound of at least one of the metals of the ferroelectric oxide. Preferably these are inorganic metal salts provided in an aqueous solution, and other constituents are provided in solvents that are water miscible. Thus the proportion of organic components of the precursor solution is reduced relative to known precursor solutions in which all metals are provided by metallo-organic precursor compounds.

According to another aspect of the present invention there is provided a sol-gel precursor solution for preparing a ferroelectric dielectric for an integrated circuit comprising a complex oxide the general formula of $ABO_3$, where A and B each comprise at least one metal, the sol-gel precursor solution comprising a mixture of a first constituent and a second constituent, the first constituent comprising a solution of an inorganic salt of at least one of metals A in an aqueous solution, the second constituent comprising a solution of an organo-metallic compound of at least one other metal B selected from the group consisting of metal alkoxides, metal alkoxide derivatives, metal carboxylates and metal betadiketonates, dissolved in a water miscible solvent selected from the group consisting of alcohols, carboxylic acids, and ketones, the first and second constituents being mixed to form a homogeneous sol-gel solution.

The combination of inorganic and organic precursors results in a reduction of organic by-products, and thereby aids in reducing the carbon content in the bulk of the film during the spinning and firing stages of film processing. The time required for firing and annealing cycles is substantially reduced. The oxygen stoichiometry of the film material, the surface morphology, transparency, thickness uniformity, film stress, and the electrical properties of the ferroelectric film are also improved.

The sol-gel precursor solution provides particular benefits for processing for integrated circuit applications using rapid thermal annealing at relatively low temperatures compatible with fabrication of integrated circuits. In particular, a suitable choice of annealing atmosphere and processing conditions provides for improved quality of ferroectric materials.

Thus, according to another aspect of the present invention there is provided a method of providing a layer of a perovskite ferroelectric material of structure $ABO_3$ on a substrate comprising:

providing on the substrate a coating of a sol-gel precursor solution a sol-gel precursor solution for preparing a perovskite ferroelectric material of general formula $ABO_3$ wherein A and B each comprise one or more metals, the solution comprising a mixture of compounds of metals A and B wherein a least one of the compounds of A and B is provided by a solution of a soluble inorganic metal salt, and the other metals are provided as metallo-organic compounds, heating the coating to stabilize and drive off volatile organic components and solvent and to pyrolise the coating to form oxides, and then heating the coating to a higher temperature to form a required crystalline phase of a ferroelectric material, the heating steps being carried out by rapid thermal processing in an annealing atmosphere comprising oxygen, ozone and water vapour.

Preferably both steps of heating the coating are carried out by rapid thermal annealing. The presence of ozone and water vapour during annealing was found to speed up oxidation and provide for crystallization at lower temperature.

Beneficially, a sol-gel precursor solution is provided for forming lead containing perovskite type mixed oxides using an inorganic lead precursor for metal A. For example, lead zirconate titanate is prepared from a mixture in which lead is provided as a soluble inorganic lead salt, preferably lead nitrate. Zirconium and titanium may be provided as alkoxides, or alternatively zirconium may be provided an inorganic salt, e.g. zirconium nitrate. Other soluble inorganic metal salts, e.g. chlorates, may be used if they are not incompatible with device processing. These sol-gel solutions were also found to be stable during storage over extended periods. Dopant metals may be added to the sol-gel precursor solutions in appropriate quantities by addition for example, of organic or inorganic compounds of niobium, lanthanum, aluminum, vanadium, tantalum or chromium.

Other lead containing perovskite ferroelectric materials are provided by suitable mixtures or inorganic and organic metal compounds, e.g. lead iron niobate, and lead magnesium niobate, lead strontium niobate, and lead strontium titanate. The latter materials in particular have useful piezoelectric properties.

Similarly, a sol-gel precursor solution for forming barium strontium titanate may also be prepared in which strontium is provided by a water soluble inorganic strontium salt, and barium and titanium are provided as a barium carboxylate and a titanium alkoxide.

According to another aspect of the present invention there is provided a method of providing a layer of a perovskite ferroelectric material of structure $ABO_3$ on a substrate, comprising:

providing a sol-gel precursor solution comprising mixture of an inorganic metal salt of a metal A, and an alkoxide of at least one metal B in predetermined proportions dissolved in a aqueous solvent, providing a coating of the sol-gel precursor solution on the substrate;

heating the coating to stabilize and drive off volatile organic components and solvent and to pyrolise the coating to form oxides, and then heating the coating to a higher temperature to form a required crystalline phase of a ferroelectric material.

Thus, the sol-gel precursor solution is conveniently provided as an aqueous, solution. Beneficially, the solution is prepared having a suitable viscosity and surface tension, to allow for spin-coating onto a substrate using conventional known coating apparatus.

The method may be used advantageously in fabricating films for devices structures with reduce film cracking during the thermal processing on large diameter substrate wafers. Stress reduction is particularly advantageous in formation of thicker films, i.e. ~10 $\mu$m thick, which may be achieved by multiple coatings.

The steps of coating with precursor solution and heating may be repeated sequentially, as required, to build up a layer of a required thickness of ferroelectric material. Thicker structures are provided by building up multiple coatings, layer by layer.

Preferably the resulting film is annealed at between 450° C. to 700° C. to induce crystallization of the film to form a crystalline perovskite phase. Annealing by rapid thermal annealing is preferred, particularly for integrated circuit applications. Advantageously, annealing by carrying out each heating steps in oxygen and ozone in the presence of water vapour provides for crystallization at reduced temperature, and with reduced processing times relative to annealing in dry oxygen.

Thus, there is provided a low temperature process by which perovskite ferroelectrics may be reproducibly deposited on an appropriate substrate, and compatible with fabrication of integrated circuits by conventional CMOS and bipolar process technologies.

Preferably, high purity precursor materials are selected to avoid constraints on processing which may arise from other factors, i.e. contamination of semiconductor devices structures by certain elements which may be detrimental to device characteristics. These elements are desirably eliminated from processes for semiconductor processing, e g. a chloride free process may be preferred for silicon processing technology.

In application of the sol-gel solution in a method for fabrication of PZT, a wide range of compositions from about 20:80 to 80:20 zirconium to titanium ratio was found to produce ferroelectric dielectrics with excellent characteristics over a wide range of frequencies, up to microwave frequencies. A preferred composition was 60:40 Zr:Ti. Dopants, i.e. lanthanum or niobium, are added to the PZT precursor if desired, and did not significantly affect the microwave performance.

The sol-gel precursor mixture and method was also used successfully in fabrication of other lead containing complex oxides having suitable properties for ferroelectric dielectrics and as piezoelectric materials. For example, good quality PLZT, and lead magnesium niobate and lead iron niobate thin layers were also provided using one or more appropriate inorganic metal precursor compounds.

According to a further aspect of the present invention there is provided, a method of forming a ferroelectric dielectric comprising polycrystalline lead zirconate titanate for integrated circuit applications, comprising:

providing on a substrate a coating comprising an aqueous sol-gel precursor solution comprising a mixture of lead nitrate, and zirconium and titanium alkoxides;

heating the coating to form an amorphous layer of ferroelectric precursor material;

then, annealing the layer of amorphous ferroelectric precursor material at a temperature sufficient to cause a phase transformation to a ferroelectric polycrystalline perovskite phase;

both the step of heating and the annealing step comprising heating in an oxygen containing atmosphere in the presence of water vapour, thereby providing a ferroelectric layer of lead zirconate titanate.

In providing materials, including PZT, for high frequency (microwave) applications, annealing is beneficially carried out in an atmosphere comprising oxygen and ozone, and in the presence water vapour, at lower temperature, i.e. ~500° C. Under these conditions uniform growth of fine grained polycrystalline material occurs, and grain sizes growth above about 20 nm were not observed. Superior high frequency characteristics were observed for material characterized by uniform small grain sizes.

Thus the present invention provides a sol-gel precursor solution for formation of ferroelectric dielectric material and piezoelectric materials, and a method of formation of a ferroelectric material which overcome or reduce some of the above mentioned problems, with particular application to forming lead containing perovskite ferroelectric materials including PZT, PLZT and PMN and others.

DESCRIPTION OF THE PREFERRED EMBODIMENTS

The invention provides a sol-gel precursor solution and a method for preparing a thin layer of a perovskite ferroelectric material of general formula $ABO_3$ wherein A and B each comprise one or more metals, with particular application for integrated circuit applications and for fabrication of microelectronic devices. Whereas all known sol-gel precursor solutions for forming complex ferroelectric metal oxides use organic metal compounds as precursors for the metal oxide, in this method, at least one of the main constituent metals in the precursor solution is provided as a soluble inorganic salt. In particular, for forming lead containing perovskite materials, lead is derived from an inorganic lead precursor, and the latter is preferably provided in an aqueous solution.

For example, to form the ferroelectric material lead zirconate titanate according to a first embodiment of the present invention, the metal occupying the A sites in the $ABO_3$ structure comprises lead, and metal occupying the B sites is a mixture of zirconium and titanium, in desired stoichiometric proportions, typically in the range 20:80 to 80:20 Zr:Ti.

A method of preparing a sol gel precursor solution according to a first embodiment which specific to the fabrication of PZT is described below. The following general description of the method also applies to formation of other perovskite ferroelectric materials using other appropriate metal precursors.

A sol-gel precursor solution is provided, resulting from a mixture of metal salts of A and metal salts of B wherein a least one of metal salts of A and B is provided by an aqueous solution of water soluble inorganic metal salt, and the remaining metals are provided as metallo-organic salts of metals A, B, or a mixtures of metallo-organic salts of metals A and B. The aqueous precursor solution including inorganic metal salts thus differs from known prior art sol-gel precursors in which all constituent metals are provided as organo-metallic salts, e.g. as metal alkoxides.

In most respects the preparation of the sol-gel precursor solution, and choice of suitable solvents, control of surface tension and viscosity is similar to that of known sol-gel processes using organo-metallic precursors. The process of the invention differs in that the inorganic metal salts are preferably provided as aqueous solutions of suitably soluble inorganic metal salts, and solvents for the other metal precursors, which are provided as alkoxides or organo-metallic salts are dissolved in a solvent miscible with the aqueous inorganic metal salt. The constituents of the solution are mixed to form a homogeneous solution, preferably with ultrasonic agitation. The organic loading of the precursor solution is thus substantially reduced in respect of the solvents as well as the metal precursors.

In a method of preparing thin layers of ferroelectric material, the sol-gel precursor solution is dip-coated or spin-coated on to a suitably prepared substrate in a conventional manner and heat treated. As in known sol-gel processes, a low temperature heating step. For example, for PZT, this heating step is typically in the range to about 400° C. or below. This low temperature step stabilizes the film and drives off volatile components and solvent from the precursor mixture leaving a mixed oxide precursor. Then a higher temperature heating step, or annealing, in a suitable atmosphere, transforms the film into the required perovskite ferroelectric phase of the complex mixed oxide. The annealing atmosphere for the lower temperature heating step and the higher temperature heating step is important in determining the properties of the resulting ferroelectric material. As an initial step, the low temperature heating step may be preceded by heating to about 100° C. to dry the film, i.e. a drying step similar to that described in U.S. Pat. No. 4,963,390 to Lipeles et al.

As is conventional in spin coating, thicker layers are built up by sequential multiple thin coatings and low temperature heat treatments. Once the required thickness is built up, the layer is annealed at the higher temperature in a suitable atmosphere.

A sol-gel precursor solution for preparing a ferroelectric dielectric for an integrated circuit comprising a complex oxide the general formula of $ABO_3$ where A and B each comprise at least one metal or mixtures of metals is prepared from a mixture of a first constituent comprising an aqueous solution of the inorganic salt of metal A, and a second constituent comprising a solution comprising an organo-metallic salt of at least one other metal B selected from the group of metal alkoxides and metal alkoxide derivative, dissolved in a suitable solvent selected from anhydrous alcohols, acetic acid, acetyl acetone, etc. The constituents are mixed to form a homogeneous sol-gel solution. Adjustment of the pH provides that hydrolysis and polycondensation reactions to form the precursor metal oxide polymer networks are controlled, and if required a viscosity modifier and surface tension modifier are added to provide a solution with the desired rheological properties for spin or dip coating thin or thick layers, as required.

In summary, the general method of the invention for preparing a ferroelectric thin film comprises the following steps:

1. A sol-gel precursor solution is prepared from an inorganic metal salt which is dissolved in a solvent, preferably water, and is mixed with organo-metallic starting material dissolved in the same or a different solvent. When two or more inorganic salts and/or two or more organic solutions are present, mixing is done in a manner so as to avoid the formation of any precipitate;

2. The resulting sol-gel precursor solution is used to make a thin layer on the substrate by use of conventional spray coating, dip-coat or spin-cast methods;

3. The layer is optionally dried by heating to about 100° C., and then heated to 350–400° C. for a time ranging from a few seconds to a few minutes, preferably by rapid thermal processing, to remove the volatile solvents and carbon, and to form a stress-free amorphous film containing the inorganic metal oxide constituents;

4. A rapid thermal annealing treatment, preferably in an oxygen containing atmosphere, in the form of a 100° C./sec ramp to above 450° C., typically above 500° C. and 600–800° C. if compatible with other process steps, which is then held for ~10 seconds to several minutes, to crystallize the films into the required crystallographic phase.

Advantageously, it was found that the use of an inorganic metal salt reduced the organic components of the precursor solution, reducing the anneal time, and allowing for transformation to a ferroelectric phase to occur at lower temperature, as will be described in the following embodiments. The resulting films had lower carbon content, improved oxygen stoichiometry and reduced stress. These improvements are attributed to the reduction in organic residues in the precursor films. Use of the sol-gel precursor in combination with rapid thermal processing and annealing, preferably in an oxygen containing atmosphere in the presence of water vapour, was beneficial in providing ferroelectric materials of improved quality for integrated circuit applications.

The reduction in organic loading of the precursor solution, increases the availability of oxygen during processing and thus improves the quality of the fired films.

Inorganic compounds may often be obtained with higher purity than organic precursor materials, and at lower cost. During processing the inorganic salt, e.g. a nitrate, may readily decompose to provide oxygen to the reaction which assists in maintaining high level of oxygen stoichiometry.

The method will be described by way of example, as illustrated by an application for formation of a layer of the perovskite ferroelectric dielectric lead zirconate titanate PZT for an integrated circuit capacitor structure.

Other Examples describe variations on the method of formation of PZT from different precursor compounds. Further Examples are also described for formation of other lead containing perovskite ferroelectric materials from sol-gel precursors comprising inorganic metal oxide precursors. Yet another example provides a method of forming barium strontium titanate from an inorganic precursor.

In a method of forming a ferroelectric dielectric for a capacitor structure according to a first embodiment of the present invention, the ferroelectric thin film of lead zirconate titanate is fabricated as part of a ferroelectric capacitor structure formed on an integrated circuit substrate comprising a semiconductor silicon wafer. A conductive bottom electrode of a capacitor was defined on an insulating layer on the substrate by a known method. The bottom electrode comprises either a single conductive layer, or preferably comprises a multilayer structure including a conductive barrier layer and an adhesion layer to improve adhesion to the underlying dielectric layer. The bottom electrode was formed from a layer of sputtered platinum.

A layer of ferroelectric lead zirconate titanate (PZT) was then formed on the bottom electrode using a spin-on sol-gel precursor solution comprising a mixture of lead zirconium and titanium precursors. The lead precursor was selected from a water soluble inorganic lead salt, i.e. lead nitrate $Pb(NO_3)_2$ dissolved in distilled water. Zirconium and titanium were provided as a mixture of alkoxides in the desired ratio, i.e. a 40:60 mole ratio of zirconium propoxide and titanium iso-propoxide, dissolved in a mixture of methoxy-ethanol and acetyl acetone.

The sol-gel precursor solution was applied to the substrate using a known spin-on liquid process to apply to the substrate a thin layer of the sol-gel precursor.

The layer of as-deposited material was first dried at 100° C. for about 30 seconds and then heat treated at low temperature, i.e. below <450° C. for about 30 to 90 seconds, to drive off volatile organic components and to form an amorphous layer. To build up a layer of the required thickness, several thin layers were sequentially deposited and heat treated. The resulting amorphous layer was then annealed by a rapid thermal annealing (RTA) process at above 450° C., and up to 650° C. in an annealing atmosphere comprising oxygen, preferably in the presence of water vapour, for 30 seconds to several minutes. Water vapour was conveniently introduced into the annealing atmosphere of the rapid thermal anneal (RTA) system during the annealing of the PZT by passing oxygen ($O_2$) through a double bubbler containing purified deionized (DI) water, so that the oxygen was saturated with water vapour, e.g. using a gas flow rate of about 2 L/min. Ozone is preferably added to the annealing atmosphere to speed up oxidation. The latter annealing atmosphere was found to be beneficial for annealing by rapid thermal processing, where processing time is relatively short compared with conventional furnace annealing processes. Beneficially, the first heat treatment is also carried out in the same annealing atmosphere comprising oxygen, ozone and water vapour.

The use of inorganic metal salts as metal precursors, rather than organo-metallic compounds, such as alkoxides, reduces the carbon content and improves oxygen stoichiometry of the ferroelectric films.

In selecting an inorganic metal salt, an oxygen containing salt, i.e. a nitrate, which is soluble in water, acid or alcohols is preferred. In respect of lead, there are several crystalline salts, but, with the exception of lead acetate and lead nitrate, most are only sparingly soluble in water, e.g. $PbF_2$ and $PbCl_2$. Others e.g. lead sulfate, and lead chromate are insoluble in water. As described below in Example 2 below, another suitable soluble lead salt tested was lead perchlorate. However, as mentioned above, chlorine containing compounds often avoided in silicon processing.

Previous work has suggested that the order of mixing of the precursors to provide the sol-gel solution may be important. In this process, there was no apparent difference in the resulting films, whether the Zr and Ti precursors were mixed initially, or added sequentially to the aqueous lead solution. A preferred composition was 40:60 Zr:Ti, although a range of compositions having from 20:80 Zr:Ti to 80:20 Ti were prepared.

The method is applicable to formation of undoped and doped PZT, e.g. using La, Nb in place of part of the lead. Other dopants including Ta and Cr may replace some of the lead, and/or zirconium and titanium atoms in PZT. These dopants are typically added to the precursor mixture as alkoxides or acetates in suitable amounts. Other suitable dopants reported in the literature include Al, Mn, V, Fe.

As discussed in more detail in related U.S. Pat. No. 5,728,603 to Emesh, McDonald and Chivikula entitled "Method of forming crystalline ferroelectric dielectric material for an integrated circuit," crystallization at lower temperature was achieved when using low concentrations of ozone in the annealing atmosphere, and annealing in the presence of water vapour. The effects of varying the composition of annealing atmosphere and the annealing temperature on film stress and leafage current were investigated and results are reported in more detail in U.S Pat. No. 5,728,603, which is incorporated herein by reference.

The presence of water vapour during annealing significantly reduced the film stress of the resulting ferroelectric layers relative to annealing in dry oxygen or dry ozone/oxygen mixtures. Nevertheless film stress values were still significantly higher than the stress levels typically found in bulk ceramic samples of PZT. Addition of ozone speeded up oxidation and allowed reduced anneal times to achieve low temperature crystallization. The combined effect of oxygen/ozone in the presence of water vapour was found to reduce significantly the temperature and time required for crystallization to occur, i.e. from above 650° C. in dry oxygen only, to about 450° C. in the presence of water vapour and ozone/oxygen. X-Ray diffraction studies confirmed that crystallization to a perovskite phase occurred at 450° C. Grain sizes were measured by X ray diffraction and found to be uniform and less than 20 nm.

Another significant observation is that, samples prepared according to method described above showed superior characteristics at high frequencies, with very significantly reduced dispersion in the microwave region up to at least 10 GHz compared with PZT formed by conventional known methods.

It has generally been observed that the PZT made by known conventional processes shows dispersion at high frequencies above –100 MHz, above which frequency the dielectric constant of PZT was observed to drop a very low value <10. Thus, although BST generally requires higher temperature processing that PZT, it has been considered a ferroelectric material of choice for high frequency applications in the microwave (GHz) frequency range, e.g., as described in related U.S. Pat. No. 6,077,715 to Chivikula et al., entitled "Ferroelectric dielectric material for integrated circuit applications art microwave frequencies," which is incorporated herein by reference, a method of preparing PZT with improved high frequency characteristics by annealing in oxygen and ozone, preferably in the presence of water vapour, at low temperature provide PZT layer having a dispersion up to at least 10 GHz.

In seeking to explain the superior functional characteristics at high frequency, for the PZT ferroelectric dielectric formed by the present method, the effect many variables were considered. Samples having high frequency response were characterized by uniform small grain size below 200 Å (20 nm), typically in the range from 100 to 150 Å (10–15 nm). By comparison, it is known bulk PZT samples prepared by conventional methods for preparing bulk ceramics e.g. sintering, provide relatively large grain sizes in the range of 10 to 15 $\mu$m.

While the superior high frequency response of the present samples is yet not fully understood by the applicant, it is believed that the a key to high frequency response is reproducible, uniform small grain size. It is also believed that the use of inorganic metal precursors is beneficial in controlling the high frequency characteristics, because similar high frequency characteristics have not been achieved when using only conventional organo-metallic precursors. Reduced organic residues and improved oxygen stoichiometry appear to be significant in the improved quality and uniformity of the ferroelectric material.

PZT formed from several different mixtures provided similar high frequency characteristics. The Zr:Ti composition of the sol-gel mixture was varied from 20:80 to 80:20, and annealing was carried out in the range from 500° C. to 650° C. The composition of the sol-gel mixture did not appear to influence the grain size significantly, and typically the preferred mixture was 60:40 ratio of zirconium to titanium. While low temperature annealing, by rapid thermal processing, at 500° C. appeared to favour small grain size, grain sizes in the range of 10 to 15 nm were obtained by annealing even at temperatures as high as 650° C. No evidence was obtained to indicate that the grain growth was influenced significantly by doping of the PZT with dopants, including for example, lanthanum and niobium.

The effect of the introduction of water vapor in the annealing ambient on the stress and crystallization kinetics was studied in the related work reported in the above mentioned copending patent application. The initial focus of this effort was a reduction of the crystallization temperature of the PZT from ~650° C. to <500° C. However, this led to the discovery that the presence of water vapour during annealing has a significant effect in reducing film stress. The introduction of water vapour by bubbling $O_2$ or an $O_2/O_3$ mixture through purified, de-ionized water into the rapid thermal anneal (RTA) system during the annealing of the PZT resulted in crystallization at about 450° C., with improved or comparable physical properties and electrical properties. In particular, annealing at low temperature 450–500° C. in the presence of water vapour, as compared to the standard process in dry oxygen, resulted in a lower tensile stress ($2–3\times10^9$dyne/cm$^2$) compared to the tensile stress values of $1–2\times10^{10}$dyne/cm$^2$ that are seen in films annealed in dry oxygen ambient at $\geq$650° C. Generally, it is found to be advantageous if the film stress values be kept as low as possible in order to avoid the problems associated with the peeling of the films and adhesion to other materials. Nevertheless, it is believed that the film stress is remains high relative to bulk material. No significant correlation was found between the high frequency response and the film stress in the samples.

The dielectric constant of the ferroelectric material increased with the amount of ozone in the annealing atmosphere. Ozone concentrations in the range 0.5 to 12% were investigated. It is believed that ozone concentrations in the range up to about 20% may be beneficial for annealing of ferroelectric dielectric materials. However, annealing in higher ozone concentrations may be impractical for semiconductor processing, in view of safety concerns regarding toxicity and potential fire hazard of ozone at high concentrations, which require that unreacted ozone is destroyed before exhausting the annealing chamber to atmosphere.

Nevertheless, a rapid, low temperature method for the crystallization of ferroelectric materials such as PZT and doped PZT is provided. Furthermore, rapid, lower temperature processing is particularly advantageous in allowing ferroelectric materials to be integrated into a process flow with a restricted thermal budget.

Reduction of organic loading is particularly beneficial for rapid thermal processing because rapid reaction may hinder evaporation of organic residues and oxidation of carbon.

Crystallization of ferroelectric layers at 450° C. to 500° C. enables the fabrication of ferroelectric capacitors to be done at a temperature compatible with those used in other low temperature IC fabrication steps. The improved crystallization method produces materials with electrical properties comparable with, or better than, the corresponding materials annealed at a temperature above 650° C. in a dry oxygen ambient.

Film stress was significantly reduced in all samples annealed in the presence of water vapour. Consequently it is believed that the reduction in crystallization temperature to obtain good quality ferroelectric dielectric films is a combined effect of annealing in the presence of both ozone and water vapour. While stress reduction appeared to be associated with the presence of water vapour during annealing, it is believed that the change in stress may be instrumental in promoting crystallization of the ferroelectric phase at lower temperature in the presence of ozone.

The results presented above for annealing in the presence of water vapour, suggest that a reduction in tensile stress may be influential in favouring crystallization to the perovskite phase at a lower temperature.

The dielectric constant of PZT (40:60 Zr/Ti) films annealed by rapid thermal processing at 650° C. in dry oxygen was in the range from 500 to 550. Samples annealed in dry oxygen at 450° C. had dielectric constants ~200 to 225. Other samples annealed at between 450° C. in a mixture of oxygen/ozone and water vapour showed an increased in dielectric constant dependent on the amount of ozone in the annealing atmosphere. A sample annealed at 450° C. in wet oxygen had a dielectric constant of 400. The sample annealed at 450° C. in wet oxygen and the highest concentration of ozone had a dielectric constant near to 500 comparable with samples dry annealed at higher temperatures. Increasing the anneal temperature to 500° C. using wet oxygen and the same amount of ozone increases the dielectric constant to 550. The samples annealed in dry oxygen with ozone had a significantly lower dielectric constant than other samples.

The steady state leakage of a standard dry annealed PZT dielectric is about 60 nA/sq.cm, which is higher than the water vapor annealed PZT with 2 nA/sq.cm. The remanent polarization values are lower in case of water vapor annealed samples (90 fC/$\mu$m$^2$) compared to the dry process PZT (170 fC/$\mu$m$^2$). On the other hand, the fatigue characteristics of the remanent polarization are improved in water vapor annealed samples. In the dry annealed samples, the polarization decays to 30% of the initial value after $10^{11}$ cycles of fatigue, whereas the polarization of water vapor annealed samples decays only to 80% of the initial value.

EXAMPLE 1

Fabrication of Lead Zirconate Titanate (PZT) Films Having a Composition of 40:60 Zr/Ti, Using a Lead Nitrate Precursor Starting Materials Lead nitrate $Pb(NO_3)_2$ (12 g); zirconium propoxide (70 wt % in propanol) (5.7 g); and titanium isopropoxide (5.1 g).

Solution Preparation

Lead nitrate (12 g) was dissolved in distilled water (40 g) to form the lead precursor solution. Zirconium propoxide (5.7 g) and titanium isopropoxide (5.1 g) were mixed and methoxy-ethanol (10 g) and acetylacetone (5 g) were then added to this mixture to form the zirconium-titanium precursor. The aqueous solution of lead precursor was slowly added to the Zr—Ti precursor to form the PZT sol-gel precursor solution. To improve the spin characteristics of the solution, and to increase the wettability of the substrate, n-butanol (6 g) was added to the sol-gel solution.

Film Fabrication

The sol-gel precursor solution was spin coated onto a metallized, i.e. platinum coated, 150 mm semiconductor silicon substrate wafer using a conventional spin-coater, at a rotational speed of 4000–6000 rpm. During spinning, some of the volatile solvents were lost by evaporation. The green coloured films were then heated at 100° C. for 60 seconds to dry, resulting in further evaporation and change in colour of the films. The films were then fired in a rapid thermal processor at 400° C. for 30 to 120 seconds, followed by a rapid thermal anneal at a temperature in the range 500–650° C. for 30 to 60 seconds, with an initial ramp rate of 100° C./s. Heat treatments were carried out in an oxygen containing atmosphere comprising either dry oxygen or and oxygen/ozone mixture in the presence of water vapour. The above mentioned benefits of annealing in the presence of water vapour require that both heat steps are carried out in the presence of water vapour. The heat treatment resulted in the crystallization of the film into the required ferroelectric perovskite phase. The film thickness for a single coat was of the order of 90 nm. Thicker films were provided by building up multiple thin coatings.

The precursor solutions were prepared at room temperature, and were stable on storage for extended periods (months). Successful use of older solutions suggest that the shelf life of precursor solutions is at least 2 years. The properties of the final films showed no evidence of degradation related to aging of the solution with time after mixing.

A wide range of compositions of PZT thin films can be fabricated by providing Zr—Ti precursor solutions having appropriate relative proportions of Zr and Ti precursors. In general, whether the Zr propoxide and the Ti iso-propoxide was initially mixed, or was added sequentially to the lead precursor solution, was not critical.

Multiple layers of PZT films were fabricated either by coating the film, firing to 400° C., and then recoating, or by coating the film, firing at 400° C. followed by annealing to 650° C. for 30 s, and then recoating. No significant differences were observed between the properties of the resulting films. Advantageously, for making films with a larger numbers of thin coats, the viscosity of the precursor solution is reduced.

The viscosity of the solution was decreased or increased by changing the amounts of water, methoxy-ethanol and acetyl acetone making up the solution. This resulted in a corresponding decrease or increase in the thickness of the layer deposited in a single coat. Minor changes to the composition ratio of Zr(40):Ti(60) described in Example 1, were best accomplished by the varying the appropriate quantities of all three component solutions i.e. the lead nitrate, Zr propoxide, and Ti propoxide solutions. Other organic viscosity modifiers (glycols) reported in earlier work of the current inventors were not used in these solutions.

Precursor solutions for PZT were prepared with excess lead, in the range from 16 to 20%. As reported in the literature, excess lead is beneficial in suppressing formation of the pyrochlore phase during annealing to form a ferroelectric perovskite phase.

The processes described in the above example produced PZT films with the following characteristics. Films 180 nm thick could be reproducibly prepared by two successive coatings on a platinized silicon wafer 15 cm in diameter. The coating thickness was uniform to <5% across the wafer and no cracks or imperfections could be observed. No delamination of the film took place, indicating low internal stress. The initial firing temperature was successfully accomplished at 400° C., which is lower than other known film fabrication procedures. The films were annealed to obtain crystallization at between 500° C. and 650° C. for 30 to 60 seconds using rapid thermal processing.

The lead nitrate based PZT films reproducibly and repeatably showed a dielectric constant of about 550 and a tan k=0.02. The remanent polarization depends on the composition, but varied from 22 for the compositions of Example 1 to about 30 for the optimum composition having a Zr:Ti ratio of 40:60. The coercive fields ranged from 80–100 kV/cm. The steady leakage current leakage was 5 nA/cm2 at 3V. The films were optically transparent and were of a quality suitable for integrated circuit applications. Under fatigue cycling (5V at 2 MHz AC), cycle lifetimes of $>10^{12}$ cycles were achieved.

EXAMPLE 2

Preparation of Films of a PZT (50/60) Composition Using a Precursor Solution Comprising Lead Perchlorate Starting Materials a) lead perchlorate $Pb(ClO_4)_2.3H_2O$ 10 g.

b) zirconium propoxide (70% in propanol) 4.06 g.

c) titanium iso-propoxide 3.7 g.

Solution Preparation

Lead perchlorate (10 g) was dissolved in water (10 g). Zirconium propoxide (4.06 g) and titanium iso-propoxide (3.7 g) were mixed and dissolved in acetylacetone (3 g) and methoxy-ethanol (5 g). The lead perchlorate solution was slowly added to the zirconium-titanium precursor mixture to form the PZT precursor solution. To improve the spin characteristics of the solution, and to increase the wettability of the substrate, n-butanol (6 g) was added to the sol-gel solution.

The solution was spin coated at 3000–5000 rpm onto a metallized silicon substrate. The resulting green coloured films were fired at 350–400° C. for 30 seconds, and annealed by rapid thermal processing at 650° C., with a ramp rate of 100° C./sec for 30 seconds. Annealing was carried out in an oxygen/ozone containing atmosphere, both dry and in the presence of water vapour and ozone.

The properties of the resulting films were satisfactory, but not as good as for lead nitrate based solutions. The stability of the perchlorate solution with time was also not as good as the nitrate based solution. Furthermore, it is desirable for many silicon integrated circuits to avoid chloride containing precursors.

Nevertheless, it is recognized that other inorganic precursors can also be used for fabrication of thin films by other variations of this method using alternative soluble lead salts.

In the following examples, two metals are provided by inorganic precursors.

EXAMPLE 3
Preparation of PZT (40:60 Zr:Ti) Using Lead Nitrate and Zirconium Nitrate Starting Materials Lead nitrate $Pb(NO_3)_2$ (11 g); zirconium nitrate $ZrNO_3.H_2O$ (2.8 g); titanium isopropoxide (5.15 g).

Precursor Solution Preparation

The lead precursor was prepared by dissolving lead nitrate (11 g) in distilled water (25 g). Zirconium Nitrate (2.8 g) was dissolved in distilled water (5 g). Titanium propoxide (5.15 g) was modified by addition of with (15 g) and acetylacetone (5 g). Sufficient amounts of these solvents added to the titanium propoxide allow for the aqueous solutions to be added without precipitation, to form a clear and stable solution. The zirconium and lead solutions were added to the titanium propoxide precursor, and finally n-butanol (7 g) was added to the solution to improve the wettability of the substrate.

The relative-weights of zirconium nitrate and titanium isopropoxide were adjusted to fabricate films with different compositions. However, using zirconium nitrate as a precursor, it was more difficult to fabricate good quality PZT films with zirconium to titanium ratios greater than 40:60 Zr:Ti.

The decomposition of a precursor solution comprising at least in part inorganic metal salts overcomes problems associated with the prior solution method of fabricating thin film oxide ceramics by using metallo-organic chemicals as the starting materials. Inorganic compounds can generally be obtained at higher purity and at lower cost than comparable metal-organic compounds. During processing, the inorganic salts decompose readily, preferably providing oxygen to the reaction to maintain high levels of oxygen stoichiometry and reduce the amount of carbon containing residues. The selection of inorganic salts is based on the solubility of the salt in a solvent, for example, water, alcohol, alkali, acetylacetonate or acetic acid or other organic acid. The dissolved inorganic salt solution containing metal cations such as lead, iron, barium or magnesium should be compatible on mixing with an organic solution containing other metal ions such as zirconium, titanium and niobium so that a clear solution without precipitates is obtained. Ultrasonic agitation assists in providing a homogeneous mixture. This solution is then used to spin coat or dip a thin wet film on a substrate which is fired at 350–400° C. in air or other oxygen containing atmosphere for 10–30 seconds. The fired film is amorphous and is typically crystallized by annealing at 600–800° C. for 10–30 seconds in a rapid thermal processing (RTP) furnace. Beneficially, when higher temperature processing and processing time is restricted for example, for compatibility with other process steps in integrated circuit fabrication, rapid thermal annealing in the presence of ozone and water vapour provides for rapid crystallization at temperatures as low as 450° C. to 500° C.

A significant reduction in the firing and annealing times compared to other sol-gel processing is evident in the process of fabricating oxide films using inorganic constituents, demonstrating the feasibility of successfully using rapid thermal processing to obtain good quality films. The films have lower stress, which reduces the mechanical and adhesion requirements for substrate metallizations. It is also possible to grow thick films ~10 µm by a multiple coating procedure, while avoiding high stresses and consequent cracking, which is common in films fabricated using known conventional methods. Improvements in the surface morphology, optical transparency, dielectric and ferroelectric properties are observed in these films, compared to those obtained using known prior art methods based on organometallic precursors.

A wide range of oxide thin films and thick films have been fabricated using the process.

The procedures may be employed to fabricate a range of other ferroelectric thin films. The following examples illustrate the fabrication of other lead containing perovskites ferroelectric materials. Similar methods could be used to fabricate films which are based on other ferroelectric systems, for example, to fabricate ferroelectric orthorhombic lead niobate. In principle, procedures of the Examples described above could be followed using lead nitrate, or lead chlorate, and niobium ethoxide precursors.

The following Examples describe the sol-gel preparation of other ferroelectric complex oxides using two inorganic precursor compounds.

EXAMPLE 4
Preparation of Lead Magnesium Niobate (PMN) of Composition $PbMg_{0.33}Nb_{0.67}O_3$ Precursors: lead nitrate, magnesium nitrate, niobium ethoxide.

The starting materials were: lead nitrate: M.W.=331.20; magnesium nitrate hexahydrate M.W=256.41; niobium ethoxide=M.W=318.21;

Solution Preparation

Lead nitrate (11 g) was dissolved in de-ionized distilled water (30 g). Magnesium nitrate (2.71 g) was dissolved in de-ionized water (3 g) and methoxy-ethanol (3 g). Niobium ethoxide (6.4 g) was mixed with methoxy-ethanol (12 g) and acetylacetone (4 g).

The lead nitrate and magnesium nitrate solutions were mixed. This mixture was then added very slowly, dropwise with stirring, to the warm (60° C.) niobium ethoxide solution mixture.

The lead magnesium niobate sol-gel solution was coated onto the substrates by spinning the solution onto the substrates at 4000 RPM. The film was fired at 300° C., in an annealing atmosphere comprising oxygen/ozone and water vapour, followed by rapid thermal annealing (RTA) at 700° C. for 30 seconds in the same atmosphere, which transformed the films into the perovskite phase of lead magnesium niobate.

Typical properties obtained on Pt substrates were remanent polarization=5 $\mu C/cm^2$. Dielectric constant=500–550 m dielectric loss=1–2% in the range 20 Hz to 1 MHz, minimal fatigue (<10%) of polarization (up to $1 \times 10^{10}$ cycles).

Care must be taken during the fabrication of PMN films to ensure controlled mixing, otherwise difficulties such as the undesirable formation of precipitates and/or gels may occur when the nitrate solution is added to the niobium ethoxide solution mixture or vice versa. During the firing and annealing cycles, undesirable lead niobate pyrochlores form at temperatures as low at 350° C. so that the firing temperature should be kept as low as possible and should certainly never exceed 400° C. Improved results may also be obtained when the films are annealed in a preheated furnace at 750° C. without an intermediate firing step. The pyrochlore phase can be suppressed by the addition of a 3–5% excess of magnesium.

In formation of lead magnesium niobate, unlike PZT, excess lead additions do not suppress the pyrochlore phase. It is also believed that the substrate has an influence on the crystallization of the film. In this study, the films were fabricated on sputtered platinum provided on an oxidized silicon substrate.

In a variation of this process for forming lead magnesium niobate, procedures were carried out substituting other metals for magnesium, e.g. iron to form lead iron niobate or strontium to form lead strontium niobate, using the following sol-gel solutions.

EXAMPLE 5
Lead Iron Niobate of Composition $PbFe_{0.5}Nb_{0.5}O_3$

This material was prepared in a similar manner as for preparation of lead magnesium niobate described above, but using as precursors a mixture of lead nitrate, iron nitrate, niobium ethoxide.

EXAMPLE 6
Lead Strontium Niobate

This material was prepared in a similar manner as for preparation of lead magnesium niobate described above, but using as precursors a mixture of lead nitrate strontium nitrate and niobium ethoxide.

EXAMPLE 7
Lead Strontium Niobate

In a variation of Example 6 lead chlorate was successfully used as an alternative to lead nitrate to form lead strontium niobate.

In each of Examples 5, 6 and 7 annealing was carried out by rapid thermal processing in dry oxygen/ozone, and in oxygen/ozone in the presence of water vapour. In each case the wet anneal was beneficial when both the low temperature heating step and the crystallization step were both carried out in the presence of water vapour.

In further examples, thin films of lead titanate and lead zirconate were prepared by the method described above for PZT, i.e. using either one of titanium propoxide or zirconium propoxide with lead nitrate in the precursor sol-gel solution. These materials also provided high frequency performance similar to PZT discussed below, when prepared under similar conditions.

The sol-gel precursor was used to form multiple coatings on the substrates to achieve a total film thickness up to ~10 gm, without cracking. The films thus produced are suitable for dielectrics for analog capacitor structures for use in electronic circuits integrated into silicon technology, ferroelectric non-volatile memories, dynamic random access memory capacitors, and other forms of charge storage devices. Thicker films may be fabricated for high frequency acoustic resonators, or for application in devices using piezoelectric properties of these ferroelectric materials, e.g. lead magnesium niobate (PMN) and lead strontium niobate, for use as sensors or actuators of mechanical motion.

High Frequency Characteristics

PZT prepared according to the Examples described above showed no significant dielectric relaxation up to 10 GHz. Response was not measured above 10 GHz. In fabrication of capacitors for high frequency applications, sheet resistance of conductive metal electrodes and interfacial resistance may have significant influence. Thus it is important that the series resistance be reduced to acceptable values for high frequency capacitor applications, i.e. to a few mill-ohms at GHz frequencies.

At lower frequencies, electrode polarization and related phenomena give rise to some spurious dispersion in dielectric characteristics, showing a large variation from sample to sample. Capacitors fabricated with platinum top electrodes patterned by a lift-off technique showed a stronger variation in dispersion (1 to 50%), compared with capacitors formed with evaporated gold electrodes, which showed only 1 to 3% dispersion. Consequently the electrode fabrication strongly affects dielectric dispersion characteristics in the low frequency region.

In the intermediate frequency region from about 1 kHz to 10 MHz, the dielectric dispersion is minimal. An important requirement for high frequency operation is that the capacitor material should possess a dissipation factor low enough that the series equivalent resistance offered by the capacitor should at most be of the order of 10 milliohms. It is also important that the dielectric parameters do not show significant relaxation behaviour within the frequency of operation.

In the present samples, the superior dielectric dispersion behaviour is believed to be influenced by the smaller grain size associated with the thin film PZT compared with bulk, thick films obtained by sintering at higher temperatures.

The composition of the sol-gel solution has been varied over the range from 20:80 to 80:20 ratios of Zr to Ti, and typically the composition was 40:60. The ferroelectric layers were doped, for example, with lanthanum and or niobium, but there is no evidence to show that doping significantly influences grain size smaller. Other dopants such as Ta or Cr may replace part of the Pb or Zr/Ti atoms, and may also be suitable as dielectrics for high frequency applications. While PZT is most commonly used undoped, it is known that doping modifies the leakage, improves linearity and increase ferroelectric characteristics.

PZT has several advantages over BST in that the process temperature is lower and the dielectric constant higher. Requirements for barrier layers, are similar for both materials.

The above desribed sol-gel precursor solutions and methods relate particularly to the formation of ferroelectric materials for integrated circuit and microelectronic devices, in which metal A comprises lead (Pb), e.g. lead titanate ($PbTiO_3$), lead magnesium niobate ($PbMg_{0.33}Nb_{0.67}$), lead niobate ($PbNb_2O_6$) and lead zirconate titanate (PZT), doped and undoped.

Also, other embodiments of the sol-gel precursor solution and method are particularly applicable to the fabrication of ferroelectric films for memory applications, and for 'relaxor' type (e.g. lead magnesium niobate and lead iron niobate) and tungsten bronze type ferroelectric (e.g. lead niobate and lead strontium niobate) which potentially have very high dielectric constants.

In yet another example, a barium strontium titanate layer was prepared using an inorganic strontium salt as follows:

EXAMPLE 8
Barium Strontium Titanate

Precursors: strontium nitrate 2.48 g; barium acetate 7 g; titanium iso-propoxide 11.1 g.

Solution preparation: Strontium nitrate (2.48 g) was dissolved in water (7 g). Barium acetate (7 g) was dissolved in a mixture of water (20 g), lactic acid (15 g) and acetic acid (15 g). Titanium iso-propoxide was mixed with acetyl acetone (15 g) and methoxy-ethanol (15 g).

The solutions of strontium nitrate and barium acetate were mixed, and then mixture was added to the titanium iso-propoxide solution. The resultant solution was spin coated onto a substrate and heat treated as described for formation of PZT, with the exception that the annealing step was carried out at a higher temperature, between 650° C. and 850° C., and preferably in an atmosphere comprising oxygen/ozone and water vapour using rapid thermal annealing, as described above for other materials.

The resultant films comprised barium strontium titanate with a Ba to Sr ratio of 70:30. The dielectric constant increased with annealing temperature in this range, and the loss is 0.02, and is independent of annealing temperature. The dielectric constant of films annealed at 650° C., 750° C. and 850° C. was 220, 300 and 350 respectively. The films showed minimal dispersion (≦10%) at frequencies between 1 mHz and 6 GHz.

Thus, although particular embodiments of the invention have been described in detail, it should be appreciated that variations, modifications and adaptations may be made without departing from the scope of the invention as defined in the claims.

What is claimed is:

1. A method of providing a layer of a perovskite ferroelectric material of structure $ABO_3$ on a substrate, comprising:
   providing a sol-gel precursor solution comprising mixture of an inorganic metal salt of a metal A, and an alkoxide of at least one metal B dissolved in a aqueous solvent,
   providing a coating of the sol-gel precursor solution on the substrate;
   heating the coating to stabilize and drive off volatile organic components and solvent and to pyrolise the coating to form oxides, and then
   heating the coating to a higher temperature to form a required crystalline phase of a ferroelectric material.

2. A method according to claim 1 wherein metal A comprises lead.

3. A method according to claim 2 wherein the at least one metal B comprises niobium and another metal selected from the group consisting of magnesium, iron, and strontium.

4. A method according to claim 1 wherein the steps of heating the coating comprise rapid thermal annealing in an annealing atmosphere comprising oxygen and ozone in the presence of water vapour.

5. A method according to claim 4 comprising, before heating the coating to stabilize, drying the coating by heating the coating to about 100° C.

6. A method according to claim 4 wherein heating is carried out by rapid thermal processing comprising an initial temperature ramp rate of about 100° C. per second.

7. A method of providing a layer of perovskite ferroelectric material of structure $ABO_3$ comprising lead zirconate titanate wherein A comprises lead and B comprises a mixture of zirconium and titanium, comprising:
   providing a sol-gel precursor solution comprising an inorganic lead salt, and a mixture of zirconium alkoxide and a titanium alkoxide, dissolved in an aqueous solvent;
   providing a coating of the sol-gel precursor on a substrate
   heating the coating to stabilize and drive off volatile organic components and solvent and to pyrolize the coating to form oxides, and then
   heating the coating to a higher temperature to form a required crystalline phase of a ferroelectric phase of lead zirconate titanate.

8. A method according to claim 7 wherein the step of heating the coating and the step of heating the coating to a higher temperature to form a required crystalline phase are carried out by rapid thermal annealing in an oxygen containing atmosphere.

9. A method according to claim 8 wherein the oxygen containing atmosphere comprises oxygen and ozone in the presence of water vapour.

10. A method of forming a ferroelectric dielectric comprising polycrystalline lead zirconate titanate for integrated circuit applications, comprising:
    providing on a substrate a coating comprising an aqueous sol-gel precursor solution comprising a mixture of lead nitrate, and zirconium and titanium alkoxides;
    heating the coating to form an amorphous layer of ferroelectric precursor material;
    then, annealing the layer of amorphous ferroelectric precursor material at a temperature sufficient to cause a phase transformation to a ferroelectric polycrystalline perovskite phase;
    both the step of heating and the annealing step comprising heating in an oxygen containing atmosphere in the presence of water vapour, thereby providing a ferroelectric layer of lead zirconate titanate.

11. A method-according to claim 10 wherein the oxygen containing atmosphere consists of oxygen.

12. A method according to claim 10 wherein the oxygen containing atmosphere consists of a mixture of oxygen and ozone.

13. A method according to claim 10 wherein the oxygen containing atmosphere comprises oxygen and an inert carrier gas.

14. A method according to claim 10 wherein the annealing temperature is below 500° C.

15. A method according to claim 10 wherein the anneal temperature is in the range 450° C. to 500° C.

16. A method according to claim 10 wherein the oxygen containing atmosphere comprises from 0.5% to 12% ozone in oxygen saturated with water vapour by bubbling the oxygen/ozone mixture through de-ionized water.

* * * * *